(12) United States Patent
McCullough

(10) Patent No.: US 6,444,372 B1
(45) Date of Patent: Sep. 3, 2002

(54) NON ABSORBING RETICLE AND METHOD OF MAKING SAME

(75) Inventor: Andrew W. McCullough, Newtown, CT (US)

(73) Assignee: SVG Lithography Systems, Inc., Wilton, CT (US)

( * ) Notice: Subject to any disclaimer, the term of this patent is extended or adjusted under 35 U.S.C. 154(b) by 0 days.

(21) Appl. No.: 09/426,250

(22) Filed: Oct. 25, 1999

(51) Int. Cl.$^7$ ................................................ G03F 9/00
(52) U.S. Cl. ............................................ 430/5; 378/35
(58) Field of Search .................... 430/5, 322, 324; 378/24, 35

(56) References Cited

U.S. PATENT DOCUMENTS

| | | | | |
|---|---|---|---|---|
| 4,592,081 A | | 5/1986 | Eaton et al. .................... | 378/34 |
| 5,322,748 A | | 6/1994 | Watakabe et al. ............... | 430/5 |
| 5,384,218 A | | 1/1995 | Tokui et al. ..................... | 430/5 |
| 5,449,578 A | * | 9/1995 | Man .............................. | 430/5 |
| 6,037,083 A | * | 3/2000 | Mitsui ........................... | 430/5 |
| 6,048,652 A | * | 4/2000 | Nguyen et al. ................. | 430/5 |
| 6,165,649 A | * | 12/2000 | Grenon et al. ................. | 430/5 |
| 6,187,484 B1 | * | 2/2001 | Glass et al. ..................... | 430/5 |

FOREIGN PATENT DOCUMENTS

| | | |
|---|---|---|
| DE | 44 20 417 A1 | 12/1994 |
| EP | 0 082 977 | 7/1983 |
| EP | 0 265 658 | 5/1988 |
| EP | 0 706 088 A1 | 4/1996 |

* cited by examiner

Primary Examiner—Mark F. Huff
Assistant Examiner—Saleha R. Mohamedulla
(74) Attorney, Agent, or Firm—Fattibene & Fattibene; Paul A. Fattibene; Arthur T. Fattibene

(57) ABSTRACT

A reticle or mask for use in projecting a circuit pattern on a photosensitive resist covered wafer having a transparent substrate with a reflective or dielectric layer thereon. An opaque or blocking layer, for example chrome or chromium, is placed over the reflective layer. The opaque layer then has a predetermined circuit pattern etched therein. In one embodiment, the opaque layer and the reflective layer are the same size. In another embodiment, the opaque layer has a size larger than the reflective layer. This permits the opaque layer to be adjacent the substrate which is advantageous when projection optics having a high numerical aperture are used. The reticle of the present invention has particular advantage when high throughput photolithographic tools are used having an illumination source of high energy flux with a wavelength of between 157 nanometers and 365 nanometers. Illumination in this wavelength range has considerable absorption in chrome, a common opaque material used in reticles. The reflective layer or land has a reflectance greater than chrome, and preferably greater than sixty percent. Therefore, the reflective layer greatly reduces reticle warm-up and thermal distortion. This technique is applicable not just to binary mask or reticles, but also to phase masks that may, in some embodiments, have opaque blocking areas thereon.

13 Claims, 2 Drawing Sheets

NON ABSORBING RETICLE AND METHOD OF MAKING SAME

FIELD OF THE INVENTION

The present invention relates generally to a reticle, mask or photomask used in photolithography for the manufacture of semiconductor devices, and more particularly to a reticle with reduced thermally induced distortion.

BACKGROUND OF THE INVENTION

In the manufacture of semiconductors using photolithography, a mask or reticle is used to project the image of a circuit pattern onto a photosensitive resist covered wafer. As the feature size of the elements in the circuit pattern become smaller, the need for increased resolution and dimensional accuracy also increase. There have been many advances in improving the mask or reticle used in the photolithographic process. One such improvement is disclosed in U.S. Pat. No. 5,322,748 entitled Photomask And Method Of Manufacturing Thereof Comprising Trapezoidal Shaped Light Blockers Covered By A Transparent Layer, issuing to Watakabe et al on Jun. 21, 1994, which is herein incorporated by reference. Therein disclosed is a phase shift mask used to improve resolution of the image projected onto a photosensitive wafer. While such improvements have advanced the state of the art, this invention does not deal with this type of improvement. As the throughput of the tools used to manufacture semiconductor wafers is increased due to the need to increase production, problems may arise. For example, in an effort to decrease the exposure time in a photolithographic process, high energy flux illumination is used. As a result of this increase in intensity or flux, portions of the mask or reticle may absorb sufficient amounts of this energy to create undesirable thermal distortions. These thermal distortions will create errors in the imaging of the pattern contained on the reticle or mask which is projected onto a photosensitive resist covered wafer. Accordingly, lower yields would be expected in the finished semiconductor device, thereby increasing the cost of manufacture. Accordingly, there is a need for a mask or reticle that has reduced thermal distortion which can accommodate the higher energy flux illumination used in an effort to increase productivity, and as the operating resolution diminishes these effects will become more significant.

SUMMARY OF THE INVENTION

The present invention is directed to a reticle or mask used in photolithography. A transparent substrate has a reflective or dielectric layer placed thereon. An opaque or blocking layer is placed on top of the reflective or dielectric layer. Portions of the opaque or blocking layer and the reflective or dielectric layer are removed to form the desired circuit pattern to be projected onto a photosensitive resist covered wafer. In one embodiment of the invention, the desired pattern is formed on the transparent substrate by uniformly coating the transparent substrate with a reflective or dielectric layer and an opaque or blocking layer. Portions of the two layers are then sequentially removed forming a desired pattern. In another embodiment of the present invention, land portions of the reflective or dielectric layers are made undersized so that the opaque or blocking layer can be placed in contact with the transparent substrate. This reduces the thickness near the transmissive portion of the reticle.

Accordingly, it is an object of the present invention to provide a reticle which reduces thermal distortion.

It is another object of the present invention to provide a reticle that permits the use of higher illumination flux energy, thereby reducing exposure time and increasing throughput.

It is an advantage of the present invention that it is relatively easy to manufacture.

It is a further advantage of the present invention that it does not impact the use of existing photolithographic tools or equipment and processing techniques.

It is a feature of the present invention that a reflective or dielectric layer is used between the transparent substrate and the opaque or blocking layer.

It is another feature of the present invention that it can be used independent of illumination source wavelength with the appropriate reflective layer. This would include, among other wavelengths, 157, 193, 248 and 365 nanometers.

These and other objects, advantages, and features will become readily apparent in view of the following detailed description.

DETAILED DESCRIPTION OF THE PREFERRED EMBODIMENTS

Figure 1:
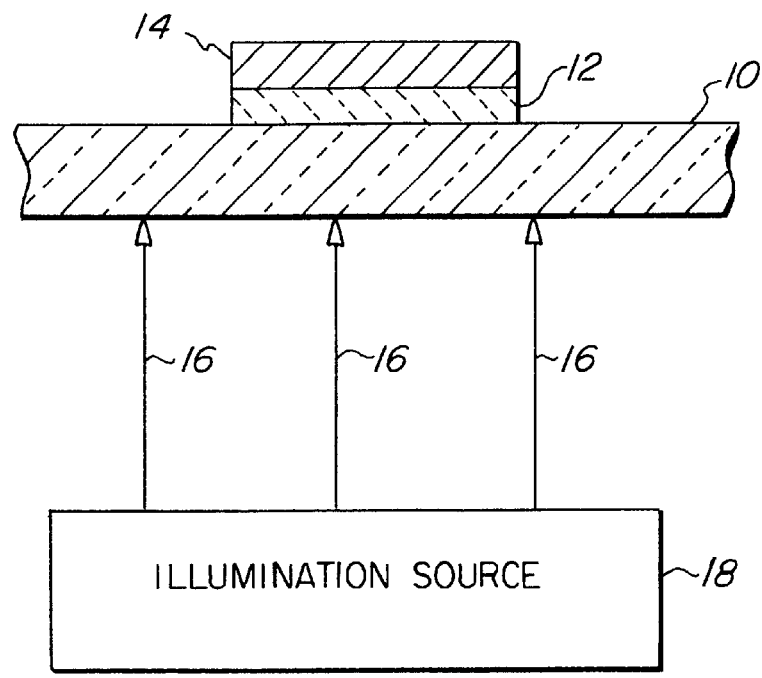
FIG. 1 is a schematic cross section illustrating a portion of the present invention.

FIG. 1 illustrates the reticle or mask of the present invention. In FIG. 1, a transparent substrate 10 is illustrated. The substrate 10 is typically made of glass, quartz, calcium fluoride, fluoride doped quartz, or other suitable transparent material. A reflective or dielectric layer 12 is placed on the top surface of the transparent substrate 10 nearest the projection optics, not illustrated. The reflective layer 12 may be made from a reflective metal, such as aluminum, or a dielectric that is reflective at the wavelength of the illumination 16 from an illumination source 18. By dielectric it is meant a high-reflectance coating consisting of alternating layers of quarter-wave film of a higher refractive index and lower refractive index than the substrate on which it is placed, or by other standard techniques. The coatings may be made very specific to a wavelength or, by varying the thickness and index spread over a broad wavelength interval. There are many known or standard materials that may be used for coatings to form a dielectric at the wavelengths of interest, 157 to 365 nanometers. On a surface of the reflective layer 12 is formed an opaque or blocking layer 14. The opaque or blocking layer 14 is typically made from a metal film such as chromium or chrome by known standards of reticle or mask manufacture. However, the opaque or blocking layer 14 may be made of any material that is sufficiently opaque so as not to activate the photosensitive resist to the extent that the desired pattern is not formed thereon. The reflective or dielectric layer 12 need only be more reflective than the normally used opaque or blocking layer 14 is at the wavelength of the illumination source 18 used to project the image of the reticle onto the photosensitive resist covered wafer, not shown. There will now be less energy absorbed in the reticle and the thermal load reduced. Patterns to be reproduced on a photosensitive resist covered wafer, not shown, are formed in the reflective or dielectric layer 12 and the opaque or blocking layer 14. Well known etching techniques are used to form the desired pattern to be reproduced.

Figure 2A:
FIGS. 2a–c are schematic cross sections illustrating the preliminary process steps in manufacturing a reticle or mask according to the present invention.
Figure 2B:
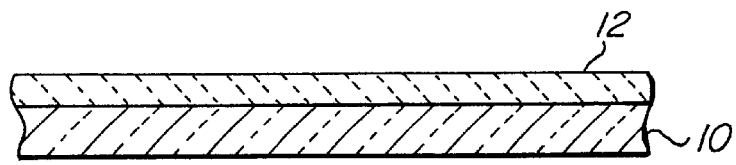
Figure 2C:
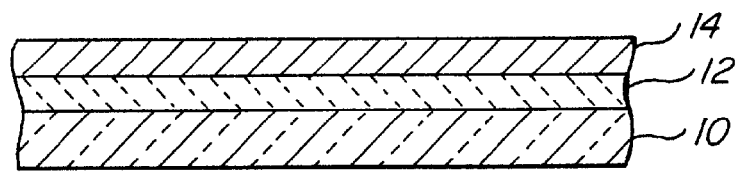

FIGS. 2a–c illustrate generally the preliminary steps used in manufacturing a reticle or mask containing a pattern thereon according to the present invention. FIG. 2a illustrates generally a cross section of the substrate 10 made from a transparent material such as glass or quartz. FIG. 2b illustrates generally a cross section of the reflective or dielectric layer 12 placed on one surface of transparent substrate 10. The formation of the reflective or dielectric layer 12 on the transparent substrate 10 may be accomplished by any means such as sputtering. FIG. 2c illustrates generally the formation of an opaque or blocking layer 14, such as chromium or chrome, placed on the reflective or dielectric layer 12.

Figure 3A:
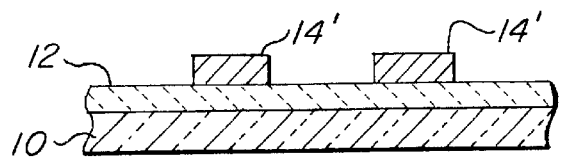
FIGS. 3a–b are schematic cross sections illustrating subsequent processing steps of a first embodiment of the present invention.
Figure 3B:
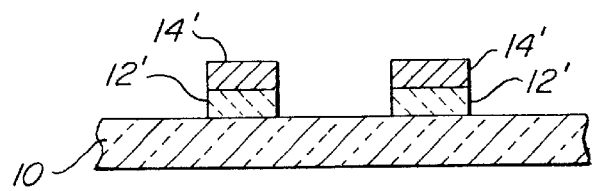

FIGS. 3a–b illustrate generally the formation of a reticle or mask according to a first embodiment of the present invention. Portions of the opaque or blocking layer 14, illustrated in FIG. 2c, are removed forming opaque or blocking lands 14'. The lands 14' may be formed by any conventional technique, such as applying an electron beam resist over the entire surface of layer 14, followed by drawing a pattern with an electron beam writing apparatus, followed by developing. Thereby, forming the lands 14'. Subsequent to the formation of the lands 14', the exposed portions of the reflective or dielectric layer 12 are etched, by a dry etching or other standard etching procedure forming reflective or dielectric lands 12' between the lands 14' and the substrate 10, as illustrated in FIG. 3b. As a result, any desired pattern may be created, such as a complex circuit pattern, forming a reticle. Accordingly, when the reticle thus formed is projected onto a photosensitive resist covered wafer, with illumination entering from the transparent substrate 10 side of the reticle, the opaque or blocking lands 14' are prevented from absorbing the electromagnetic radiation generated by the illumination source, illustrated in FIG. 1. The electromagnetic radiation from the illumination source passing through the substrate 10 is at least partially reflected by the reflective or dielectric lands 12'. As a result, the opaque or blocking lands 14' do not absorb the electromagnetic radiation. This results in less heat and therefore less thermal distortion in the reticle or mask. Chrome, which is the most common material used for the opaque or blocking layer 14 may have an absorption of as much as sixty-five percent in the wavelength region of common illumination sources, for example between 157 and 365 nanometers. The blocking layer 14 will be thin to cater to high numerical aperture systems. If aluminum is used for the blocking layer 14 the absorption will be of the order of ten percent in the wavelength range quoted. This will reduce the thermal load by more than a factor of six.

Figure 4A:
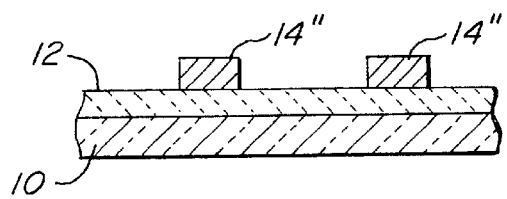
FIGS. 4a–e are schematic cross sections illustrating subsequent processing steps of a second embodiment of the present invention.
Figure 4B:
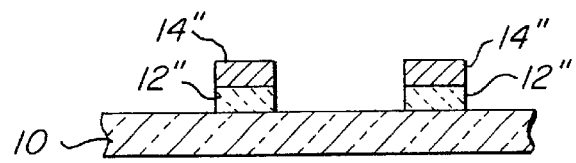
Figure 4C:
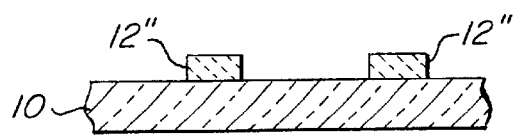
Figure 4D:
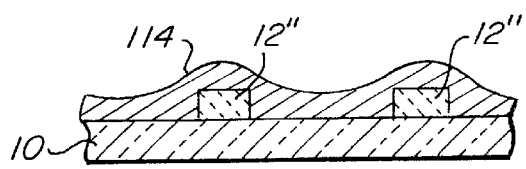
Figure 4E:
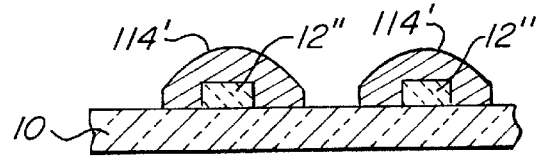

FIGS. 4a–e illustrate the steps in making a second embodiment of the present invention for providing an opaque or blocking layer which is desirable in applications using projection optics with a high numerical aperture. FIG. 4a illustrates the reticle with transparent substrate 10 having lands 14" thereon. The lands 14" are formed by conventional electron beam processing techniques as described for the embodiment illustrated in FIG. 3a. However, the lands 14" are made undersized or with a width smaller than the desired width of a circuit pattern. FIG. 4b illustrates the removal of the reflective or dielectric layer 12 that is not beneath the lands 14". Accordingly, the distance between the reflective or dielectric lands 12" is greater than the desired width of a circuit pattern to be formed. The reflective or dielectric lands 12" are therefore undersized. FIG. 4c illustrates the removal of the lands 14", which are only used in the formation of the undersized reflective or dielectric lands 12". FIG. 4d illustrates re-coating the transparent substrate 10 and undersized reflective lands 12" with an opaque or blocking layer 114. FIG. 4e illustrates the formation of the predetermined pattern forming the reticle or mask upon removal of a portion of the opaque or blocking layer 114 between the reflective lands 12", thereby forming opaque or blocking lands 114'. The opaque or blocking lands 114' are advantageous in that the edges forming the resulting pattern formed by the opaque or blocking lands 114' are near or adjacent the transparent substrate 10. This reticle or mask structure is advantageous when projection optics having a high numerical aperture are used, and therefore may have a limited depth of field.

The preliminary processing steps illustrated in FIGS. 2a–c are common to the first and second embodiments described above. FIGS. 3a–b illustrate processing steps performed in making the invention according to the first embodiment subsequent to the common processing steps illustrated in FIGS. 2a–c. FIGS. 4a–e illustrate processing steps performed in making the invention according to the second embodiment subsequent to the common processing steps illustrated in FIGS. 2a–c.

Figure 5:
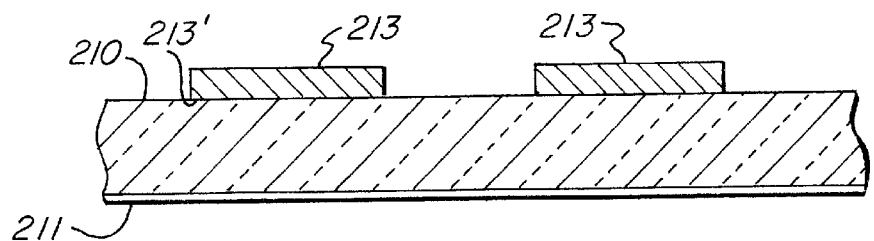
FIG. 5 is a schematic cross section of another embodiment of the present invention.

FIG. 5 illustrates another embodiment of the present invention. In this embodiment only a single layer is used. The blocking and reflective layer can be one and the same. For example, aluminum can be a single layer that is both reflective and opaque. However, the different constraints on these layers, well known to reticle or mask makers, may preclude this solution. Factors such as line edge roughness, reflectivity of the top layer, etc. may come into play. In FIG. 5, transparent substrate 210 has a layer 213 thereon forming a portion of a pattern to be reproduced. The layer 213 has a reflective surface 213' adjacent a surface of the substrate 210. The opposing surface of substrate 210 has an antireflective coating 211 thereon. An antireflective coating may also be used in the other embodiments of the present invention. In the present invention, more light will be reflected from the reticle and less absorbed. To minimize any extra reflectance from the back surface of the reticle, the unpatterned side closest to the illuminator or illumination source, preferably should have an antireflection coating at the wavelength used in the band 157 nm to 365 nm. This will minimize any extra reflections.

All of the embodiments of the present invention utilize a reflective layer. The reflective layers used in the present invention should have a reflectance greater than that of chromium or chrome at wavelengths from 157 nm and 365 nm. Chromium and chrome generally have a reflectance of approximately forty percent. That is, forty percent of the incident flux is reflected. Preferably the present invention utilizes a reflective layer or a single reflective/opaque layer having a reflectance greater than sixty percent.

Accordingly, the present invention greatly reduces reticle warm-up when illuminated by actinic radiation and thereby reduces undesirable thermal distortion which cause printing errors. The present invention therefore, improves the photolithographic process and the yields associated with semiconductor manufacturing. While the preferred embodiments have been illustrated and described, it will be obvious to those skilled in the art that various modifications may be made without departing from the spirit and scope of this invention.

What is claimed is:

1. A photolithographic reticle comprising:

a transparent substrate;

reflective lands placed on said transparent substrate, said reflective lands having a first width; and electromagnetic radiation blocking lands placed on said reflective lands and said transparent substrate, said electromagnetic radiation blocking lands having a second width, the second width being larger than the first width of said reflective lands, whereby electromagnetic radiation passing through said transparent substrate is reflected from said reflective lands prior to reaching said electromagnetic radiation blocking lands.

2. A photolithographic reticle as in claim 1 wherein:

said electromagnetic radiation blocking lands are made of chrome.

3. A photolithographic reticle as in claim 1 wherein:

said electromagnetic radiation blocking lands are made of aluminum.

4. A photolithographic reticle as in claim 1 wherein:

said reflective lands are made of a dielectric that is reflective for any predetermined wavelength of electromagnetic radiation from 157 to 365 nanometers.

5. A photolithographic reticle as in claim 1 wherein:

said transparent substrate is selected from the group consisting of quartz, fluoride doped quartz, and calcium fluoride.

6. A photolithographic reticle as in claim 1 further comprising:

an antireflective coating placed on said transparent substrate.

7. A method of making a photolithographic reticle comprising the steps of:

placing a reflective layer over a transparent substrate;

placing an electromagnetic radiation blocking layer over the reflective layer;

removing portions of the electromagnetic radiation blocking layer forming first lands;

removing portions of the reflective layer forming second lands between the transparent substrate and the electromagnetic radiation blocking layer; and placing an antireflective coating on a surface of the transparent substrate opposite said lands, whereby an electromagnetic radiation transmitting pattern is formed.

8. A method as in claim 7 wherein:

the first lands have the same width as the second lands.

9. A method of making a photolithographic reticle comprising the steps of:

placing a reflective layer over a transparent substrate;

placing an electromagnetic radiation blocking layer over the reflective layer;

removing portions of the electromagnetic radiation blocking layer forming first lands; and removing portions of the reflective layer forming second lands between the transparent substrate and the electromagnetic radiation blocking layer, wherein the first lands have a width greater than the second lands, whereby an electromagnetic radiation transmitting pattern is formed.

10. A method as in claim 7 wherein:

the reflective layer is a dielectric.

11. A method as in claim 7 wherein:

the electromagnetic blocking layer is chrome.

12. A reticle comprising:

a substrate;

lands forming a pattern to be reproduced placed on said substrate, said lands having a reflectance greater than chrome; and an antireflective coating placed on said substrate, said antireflective coating placed on a surface of said substrate opposite said lands.

13. A photolithographic reticle comprising:

a transparent substrate;

reflective lands placed on said transparent substrate;

electromagnetic radiation blocking lands placed on said reflective lands; and an antireflective coating placed on a surface of said substrate opposite said lands, whereby electromagnetic radiation passing through said transparent substrate is reflected from said reflective lands prior to reaching said electromagnetic radiation blocking lands.

* * * * *